United States Patent
Eichner et al.

(10) Patent No.: US 9,326,411 B2
(45) Date of Patent: Apr. 26, 2016

(54) CONNECTION DEVICE FOR CONNECTING AN ELECTRONIC COMPONENT TO A HOUSING PART AND ELECTRONIC CONTROLLER

(75) Inventors: Markus Eichner, Nuremberg (DE); Thomas Uhland, Pfaffenhofen (DE)

(73) Assignee: KNORR-BREMSE Systeme fuer Nutzfahrzeuge GmbH, Munich (DE)

( * ) Notice: Subject to any disclaimer, the term of this patent is extended or adjusted under 35 U.S.C. 154(b) by 277 days.

(21) Appl. No.: 13/608,807

(22) Filed: Sep. 10, 2012

(65) Prior Publication Data

US 2013/0120915 A1    May 16, 2013

Related U.S. Application Data

(63) Continuation of application No. PCT/EP2011/053143, filed on Mar. 3, 2011.

(30) Foreign Application Priority Data

Mar. 10, 2010    (DE) .......................... 10 2010 010 926

(51) Int. Cl.
```
H05K 7/14      (2006.01)
F16B 33/00     (2006.01)
F16B 43/00     (2006.01)
H05K 7/20      (2006.01)
```

(52) U.S. Cl.
CPC ............... *H05K 7/14* (2013.01); *F16B 33/004* (2013.01); *F16B 43/001* (2013.01); *H05K 7/1417* (2013.01); *H05K 7/20854* (2013.01)

(58) Field of Classification Search
CPC ....................................................... H05K 7/14
USPC .......................... 361/728, 742, 758, 770, 804
See application file for complete search history.

(56) References Cited

U.S. PATENT DOCUMENTS

| | | | |
|---|---|---|---|
| 4,546,408 A * | 10/1985 | Rodseth et al. | 361/720 |
| 5,499,163 A | 3/1996 | Sonntag et al. | |
| 5,579,217 A * | 11/1996 | Deam et al. | 363/144 |
| 6,381,136 B1 * | 4/2002 | Nelson et al. | 361/704 |
| 7,561,435 B2 * | 7/2009 | Kamoshida et al. | 361/752 |

(Continued)

FOREIGN PATENT DOCUMENTS

| | | |
|---|---|---|
| CN | 1862603 A | 11/2006 |
| CN | 101324246 A | 12/2008 |

(Continued)

OTHER PUBLICATIONS

Chinese Office Action dated Dec. 11, 2013 (8 pages).

(Continued)

*Primary Examiner* — Jenny L Wagner
*Assistant Examiner* — Michael P McFadden
(74) *Attorney, Agent, or Firm* — Crowell & Moring LLP

(57) ABSTRACT

A connection device is provided connecting an electronic component that is arranged on a carrier to a housing part. The connection device has a first bush for receiving a first fastening unit which is used to fasten the connection device to the carrier and a second bush for receiving a second fastening unit for fastening the connection device to the housing part. The first bush is thermally insulated from the second bush. A controller has an electronic component which is arranged on the carrier and which is connected or can be connected to the housing part by use of such a connection device.

10 Claims, 1 Drawing Sheet

(56) References Cited

U.S. PATENT DOCUMENTS

| | | | |
|---|---|---|---|
| 8,240,966 B2 | 8/2012 | Figge et al. | |
| 2007/0232128 A1* | 10/2007 | Onogi | H01R 23/661 439/492 |
| 2010/0039776 A1* | 2/2010 | Nuki | 361/710 |
| 2010/0091460 A1* | 4/2010 | Hinze et al. | 361/709 |
| 2010/0097768 A1* | 4/2010 | Ishii et al. | 361/719 |
| 2010/0302735 A1* | 12/2010 | Ishii et al. | 361/701 |

FOREIGN PATENT DOCUMENTS

| | | |
|---|---|---|
| DE | 36 43 288 A1 | 6/1988 |
| DE | 44 34 064 A1 | 3/1995 |
| DE | 198 11 727 A1 | 9/1999 |
| EP | 0 943 860 B1 | 10/2004 |
| EP | 1 936 124 A1 | 6/2008 |
| FR | 2 660 974 A1 | 10/1991 |
| GB | 747922 | 4/1956 |

OTHER PUBLICATIONS

German Office Action dated Jan. 12, 2011 including English-language translation (Twelve (12) pages).

International Search Report dated May 9, 2011 including English-language translation (Four (4) pages).

International Preliminary Report on Patentability (PCT/IB/338 & PCT/IB/373), including Written Opinion (PCT/ISA/237) dated Oct. 4, 2012 (seven (7) pages).

* cited by examiner

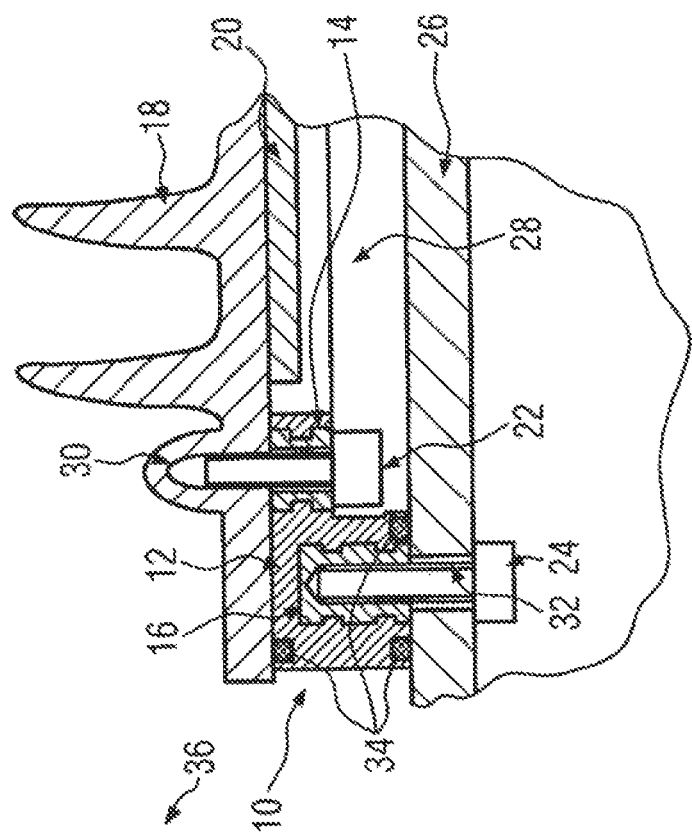

CONNECTION DEVICE FOR CONNECTING AN ELECTRONIC COMPONENT TO A HOUSING PART AND ELECTRONIC CONTROLLER

CROSS-REFERENCE TO RELATED APPLICATIONS

This application is a continuation of PCT International Application No. PCT/EP2011/053143, filed Mar. 3, 2011, which claims priority under 35 U.S.C. §119 from German Patent Application No. 10 2010 010 926.6, filed Mar. 10, 2010.

BACKGROUND AND SUMMARY OF THE INVENTION

The present invention relates to a connection device for connecting an electronic component arranged on a carrier to a housing part. The invention furthermore relates to an electronic controller having an electronic component, which is arranged on a carrier and is connected or can be connected to a housing part by means of a connection device.

One of the restricting factors in the use of electronic components and controllers in high-temperature applications, e.g. in the area of vehicles and commercial vehicles and the control thereof, is the temperature of the electronic components used. The electronic components function in a particularly efficient way at low temperatures and suffer when operated for long periods at high temperatures, resulting in a short service life. The electronic components provided for high temperature operation, in particular, are therefore often cooled and, as far as possible, are thermally decoupled from external sources of heat, e.g. an engine, a compressor or a transmission of a vehicle. For this purpose, thermally insulating connection devices are used in order, on the one hand, to connect an electronic component to a metal housing or housing part, for example, and, on the other hand, to thermally insulate the component from the latter. To provide a stable connection between the housing and the electronic component, use is generally made of bushes and screws, which produce a mechanical connection through a thermal insulation.

It is an object of the invention to improve the thermal insulation between an electronic component and a housing part to which the electronic component is fastened.

This object is achieved by a connection device for connecting an electronic component arranged on a carrier to a housing part, wherein the connection device comprises: a first bush for receiving a first fastening unit for fastening the connection device to the carrier; and a second bush for receiving a second fastening unit for fastening the connection device to the housing part, wherein the first bush is thermally insulated from the second bush.

Further advantageous embodiments and developments of the invention are described and claimed herein.

The invention provides a connection device for connecting an electronic component arranged on a carrier to a housing part. The connection device comprises a first bush for receiving a first fastening unit for fastening the connection device to the carrier and a second bush for receiving a second fastening unit for fastening the connection device to the housing part. The first bush is thermally insulated from the second bush. This prevents the existence of a heat-conducting connection between the electronic component and a housing part via a bush or a fastening unit. In this case, each of the fastening units should be designed in such a way that it serves only to fasten the connection device to a further component, that is to say either to the carrier or to the housing part. This results, therefore, in reciprocal fastening of the carrier, the connection device and the housing part.

Bolts, screws or rivets, in particular, are suitable as fastening units. For reasons of stability, it is expedient if the fastening units are produced from a metallic material, such as steel or brass. Provision can be made, in particular, to use different types of fastening units and/or different materials for the first and the second fastening unit. For example, the first fastening unit can be a screw and the second fastening unit can be a rivet or vice versa.

The bushes should in each case be matched to the type of fastening unit associated therewith. If, for example, a screw is used as a fastening unit for a bush, the bush can be designed as a threaded bush. The bushes can be designed as through bushes with two opposite openings or as bushes with just one opening. It is advantageous if at least one of the bushes is not a through bush with two opposite openings but is closed at one end in an end region of the bush.

The housing part and/or the carrier can also have mating fastening devices for fastening the fastening units. It is contemplated, for example, for the housing part and/or the carrier to have a receptacle for an associated fastening unit. Such a receptacle can be designed as a through opening, such as a through bore, or as a recess open only on one side.

It is particularly advantageous if in each case one bush and an associated mating fastening device are designed in such a way that in each case one of these two elements is designed with a through receptacle or bore for the associated fastening unit. The other of these elements then has a recess with just one opening.

It is furthermore possible for one receptacle to be provided with a thread. In general, it is advantageous if one receptacle is designed as a through hole and the other receptacle is designed as a recess closed on one side. For example, provision can be made for a through hole to be provided in the housing part for receiving the second fastening unit, while the carrier has a closed recess for receiving the first fastening unit. The respective fastening unit can then be received in the associated bush and mating fastening device in such a way that one of its ends is received in a recess closed at one end. This end of the fastening unit is then protected from external influences, and furthermore it cannot jeopardize any other components or even a user.

It is also contemplated for a through receptacle or bush to be designed without a thread, while an associated recess closed on one side has a thread. In this case, bolts which have a corresponding mating thread only at the end provided for reception in the recess are suitable as associated fastening units, for example. Of course, it is contemplated for the connection device to have more than two bushes thermally insulated from one another to receive a fastening unit for fastening the connection device to the housing part or the carrier in order to increase the stability of the connection. It is also possible to provide for the connection device to have more than two bushes in order to connect one or more electronic components or the carriers thereof to one or more housing parts.

The carrier is used to fasten the electronic component to the connection device and should provide the fastening unit with support. It can be of integral design with the electronic component and can be a substrate of a circuit board, for example. It is expedient, if the carrier and the electronic component are not of integral design, for the electronic component to be fastened to the carrier in a known manner, e.g. by soldering or screwing. The electronic component can be a circuit board, an integrated circuit, a processor, a sensor or some other suitable electronic component, for example. The electronic component can also include a plurality of such components.

The housing part can be part of a housing of a controller, for example. It is also contemplated for the housing part to be part of a housing of a vehicle component, such as an engine, a drive train, a compressor or a transmission. The housing part is preferably produced from a metallic material, in an aluminum die casting process, for instance. It can be flanged to a vehicle component, such as a transmission, for example. The connection device described is particularly suitable for use in the area of commercial vehicles, such as trucks and tractors.

It is advantageous if the connection device has a frame, in which the bushes are received. This provides good retention of the bushes. A frame of this kind can be designed as a frame which completely or partially surrounds the electronic component. In particular, the electronic component can be surrounded completely by the frame in one plane. In this case, it is particularly advantageous if the frame has more than two bushes. In particular, it is possible in each case for more than one bush for receiving fastening units for fastening the frame to the carrier and more than one bush for receiving fastening units for fastening the frame to the housing part to be provided. This results in reliable fastening of the carrier, the connection device or frame and the housing part. It is also possible for a number of connection devices of separate design to be provided.

The frame can be produced from a plastic. In particular, the plastic can be a thermally insulating plastic. This allows easy production, e.g. by use of a molding method, and ensures insulation of the bushes. In particular, the bushes can be overmolded with the plastic in order to give a connection device that is easy to produce. Polyamide containing glass fibers are particularly suitable as a frame material, providing the desired properties in terms of stability and thermal insulation.

In a preferred embodiment, the first bush and the second bush are designed with a common receiving direction for receiving the first fastening unit and the second fastening unit, respectively. During assembly, the first and the second fastening unit are thus introduced in parallel into the bushes from the same side of the connection device and, in the assembled state, are received in the bushes in parallel with one another. On the one hand, this provides easy assembly. On the other hand, it is necessary to ensure sufficient space to introduce and accommodate the fastening units on only one side of the electronic component. It is, of course, also possible to design the bushes in such a way that they are formed in different directions and hence that the fastening units are introduced into the bushes in corresponding different receiving directions. It can be particularly advantageous here if the receiving directions of the bushes are mutually opposed. In specifying a receiving direction, the presence and alignment of threads and the configuration of bushes and mating fastening units with through holes or recesses open on only one side have to be taken into account, where appropriate.

It is particularly advantageous if the first bush and the second bush are arranged offset relative to one another. This facilitates assembly and prevents parts of the fastening units from coming into heat-transmitting contact with one another in an outer area via another, heat-conducting, component arranged there.

According to a development, the first and the second bush are arranged offset relative to one another with respect to a common receiving direction for receiving the first fastening unit and the second fastening unit respectively. This counteracts an effect that ends of the fastening units, such as screw or bolt heads, protruding on one side (e.g. the side from which the fastening units are introduced into the bushes during assembly) simultaneously come into heat-conducting contact with a hot component and thus produce a heat-conducting connection.

It is particularly advantageous if the electronic component includes an electronic circuit carrier, in particular a circuit board. It is a simple matter to accommodate and mount complex circuits on such a circuit board. A substrate of the circuit board can serve as the carrier. However, it is also possible to use an additional carrier.

A cooler is preferably provided for cooling the electronic component. In this way, it is possible to keep the electronic component at a low operating temperature, especially in high temperature environments, thereby increasing its performance and service life. The cooler can be formed from a material with good heat-conducting properties. Production in an aluminum die casting process is particularly suitable, a process which can be carried out at low cost and allows the production of a low-weight cooler. The cooler can be connected to a cooling system, which thus cools the cooler. For example, provision can be made for a flow of coolant to be used to cool the cooler. The cooling system can be a cooling system of a motor vehicle.

In this context, it is expedient if the cooler is the carrier on which the electronic component is arranged. A cooler of this kind has sufficient stability to offer a good mechanical connection via a fastening unit.

The connection device can have at least one sealing device for sealing an interspace formed between the housing part and the carrier with respect to an environment of the connection device. Here, the environment of the connection device is preferably a region which is separated by the connection device from the electronic component or the interspace. The interspace offers space to receive the electronic component and any other components provided, e.g. electric leads. The interspace is preferably dimensioned in such a way that there is a spacing between an electronic component accommodated therein and the housing part. This prevents the electronic component being in direct contact with the housing part. By means of the sealing device, the interspace and hence also the electronic component are protected from moisture entering from the outside, for example.

According to the invention, a controller having an electronic component, which is arranged on a carrier and is connected or can be connected to a housing part by way of a connection device described above, is furthermore provided. This results in good thermal insulation of the control unit or electronic component from the housing part. In this case, the housing part can be part of a housing of the controller. It is also contemplated for the housing part to be part of a housing of a component other than the controller, it being possible for the component to be a component as described above. A combination of the two is also contemplated. Thus, on the one hand, an electronic component can be connected to part of a housing of the controller by way of a connection device described above and, on the other hand, this or some other part of the housing of the controller can be connected to a housing part of another component by way of such a connection device. In this case, a single connection device provided with more than two bushes can be provided in order to connect the electronic component and the housing parts to one another. It is also possible for several connection devices to be employed.

The invention will now be explained by way of example by means of a preferred embodiment with reference to the accompanying drawing:

BRIEF DESCRIPTION OF THE DRAWINGS

FIG. 1 shows a view of a connection device.

DETAILED DESCRIPTION OF THE DRAWINGS

FIG. 1 shows a connection device 10. The connection device 10 includes a frame 12 produced from plastic. The frame 12 has a first bush 14 and a second bush 16. Provision can be made for the frame 12 to be produced in an injection molding process, in which the bushes 14 and 16 are encapsulated with frame material. For reasons of stability, the bushes 14 and 16 are produced from a metallic material. As can be seen, the bushes 14, 16 have undercuts in order to achieve good retention in the frame 12. It is also contemplated to produce one or both bushes 14, 16 from some other material or to mold the frame 12 directly in such a way that shapes corresponding to the bushes are obtained to receive fastening units. The first bush 14 is designed in such a way that it offers an opening which passes through the frame 12. The second bush 16, in contrast, is closed at an end situated within the frame 12. Both bushes 14, 16 can have a thread.

FIG. 1 furthermore shows a cooler 18 and part of a housing 26. In this case, the housing part 26 is produced by an aluminum die casting process. In particular, the housing part 26 can be part of a housing of a vehicle transmission.

The connection device 10 is arranged between the cooler 18 and the housing 26 in such a way that an interspace 28 is formed between the cooler 18 and the housing part 26. An electronic component 20, in this case a circuit board 20, is accommodated in the interspace 28. An environment 36 of the connection device 10 is separated from the interspace 28 by the connection device 10. The circuit board 20 is fastened in a heat-conducting manner to the cooler 18, e.g. by means of a heat transfer compound. To fasten the circuit board 20, screws or an adhesive bond can preferably be provided (not shown). The cooler 18 is used to dissipate heat produced by the circuit board 20 during the operation of the latter. It can be connected to a cooling device of a vehicle, for example, in order to be cooled itself.

A first fastening unit 22 is received in the first bush 14, passing through the first bush 14 and being received in a mating fastening unit formed as a recess 30 in the cooler 18. The recess 30 can have a thread. The connection device 10 is thus connected to the cooler 18, which in this example acts as a carrier for the electronic component or circuit board 20.

A fastening or through hole 32, which can have a thread, is furthermore provided in the housing part 26. A second fastening unit 24 extends through the through hole 32 and into the second bush 16. The connection device 10 and the housing 26 are thereby connected to one another. To seal the housing part 26, the frame 12 and the cooler 18 with respect to one another and, in particular, to seal the interspace 28 with respect to the environment 36, seals 34 are provided. Here, one or more seals 34 can, in each case, be provided on that side of the frame 12 which faces the carrier and on that side of the frame 12 which faces the housing part 26. The first and/or the second fastening unit 22, 24 can have a thread or can be designed as screws. The bushes 14, 16 have a common receiving direction for the fastening units 22, 24 associated therewith. This means that both fastening units 22, 24 are introduced into the associated bush 14, 16 from the same direction. In this case, this is performed in such a way that they are introduced in the direction toward the cooler 18.

During assembly, the connection device 10 is first of all connected securely to the cooler 18 by way of the first fastening unit 22. The housing part 26 is then connected to the connection device 10 by introducing the second fastening unit 24 into the through hole 32 and into the second bush 16. Overall, stable fastening of the cooler 18 and of the circuit board 20 to the housing part 26 is obtained without the existence of a heat-conducting connection between the housing part 26 and the cooler 18 via one of the bushes 14, 16 or one of the fastening units 22, 24. As is readily apparent, a free space is obtained between the housing part 26 and the first fastening unit 22, and therefore the housing part 26 and the first fastening unit 22 are not in heat-conducting contact since the frame 12 is produced from thermally insulating material. The first bush 14 and the second bush 16 are also separated from one another by the thermally insulating material of the frame 12 and are not in heat-conducting contact with one another. Admittedly, the second bush 16 and fastening unit 24 are connected in a heat-conducting manner to the housing part 26. However, the fact that the second bush 16 is surrounded by the frame material 12 means that they are thermally insulated both from fastening unit 22 and bush 14 and from the cooler 18. Of course, it is possible to provide for the use of more than one connection device 10 for connecting the cooler 18 to the housing part 26. It is particularly expedient if the circuit board 20 is arranged between at least two connection devices 10 and is fastened to the housing part 26 by way of the devices. As an alternative, the frame 12 can be designed in such a way, for example, that it runs completely around the circuit board 20 and has a multiplicity of bushes 14, 16 distributed over the frame 12. It is then expedient to provide at least one, likewise encircling, seal 34 on the frame 12.

The features of the invention which have been disclosed in the above description, in the drawings and in the claims can be significant both individually and in any desired combination for the implementation of the invention.

LIST OF REFERENCE SIGNS 10 connection device
12 frame
14 first bush
16 second bush
18 cooler
20 circuit board
22 first fastening unit
24 second fastening unit
26 housing part
28 interspace
30 recess
32 through hole
34 seal
36 environment

The invention claimed is:

1. A controller, comprising:
an electronic component;
a carrier on which the electronic component is arranged;
a connection device operatively configured to connect the electronic component arranged on the carrier to a housing part, the connection device comprising first and second bushes, the first bush receiving a first fastening unit configured to fasten the connection device to the carrier and the second bush receiving a second fastening unit configured to fasten the connection device to the housing part, wherein
the first bush is thermally insulated from the second bush,
the connection device comprises a frame in which the first and second bushes are received, and
the frame surrounds the electronic component on at least two sides of the electronic component.

2. The controller according to claim 1, wherein the frame is a plastic frame.

3. The controller according to claim 2, wherein the first bush and the second bush are operatively configured with a common receiving direction for receiving the first fastening unit and the second fastening unit, respectively.

4. The controller according to claim 3, wherein the first bush and the second bush are arranged offset relative to one another.

5. The controller according to claim 1, wherein along a direction between at least the first fastening unit and the second fastening unit, the carrier and the housing part are separated by a distance corresponding to a thickness of the frame.

6. A controller, comprising:
an electronic component;
a carrier on which the electronic component is arranged;
a connection device operatively configured to connect the electronic component arranged on the carrier to a housing part, the connection device comprising first and second bushes, the first bush receiving a first fastening unit configured to fasten the connection device to the carrier and the second bush receiving a second fastening unit configured to fasten the connection device to the housing part, wherein
the first bush is thermally insulated from the second bush,
the connection device comprises a frame in which the first and second bushes are received, and
the frame completely surrounds the electronic component.

7. The controller according to claim 6, wherein the frame is a plastic frame.

8. The controller according to claim 7, wherein the first bush and the second bush are operatively configured with a common receiving direction for receiving the first fastening unit and the second fastening unit, respectively.

9. The controller according to claim 8, wherein the first bush and the second bush are arranged offset relative to one another.

10. The controller according to claim 6, wherein along a direction between at least the first fastening unit and the second fastening unit, the carrier and the housing part are separated by a distance corresponding to a thickness of the frame.

\* \* \* \* \*